(12) United States Patent
Chang et al.

(10) Patent No.: US 8,017,445 B1
(45) Date of Patent: Sep. 13, 2011

(54) WARPAGE-COMPENSATING DIE PADDLE DESIGN FOR HIGH THERMAL-MISMATCHED PACKAGE CONSTRUCTION

(75) Inventors: Bo Chang, Cupertino, CA (US); Carlo Gamboa, Milpitas, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 468 days.

(21) Appl. No.: 11/803,475

(22) Filed: May 15, 2007

Related U.S. Application Data

(60) Provisional application No. 60/802,854, filed on May 23, 2006.

(51) Int. Cl.
*H01L 23/495* (2006.01)
*H01L 21/60* (2006.01)

(52) U.S. Cl. ............... 438/123; 257/669; 257/E23.037; 257/E21.504; 257/E21.506; 257/678

(58) Field of Classification Search ............... 257/678
See application file for complete search history.

(56) References Cited

U.S. PATENT DOCUMENTS

| | | | |
|---|---|---|---|
| 6,061,242 A | 5/2000 | Corisis et al. | |
| 6,418,023 B2 | 7/2002 | Kinsman et al. | |
| 6,518,098 B2 | 2/2003 | Corisis | |
| 2003/0000082 A1* | 1/2003 | Corisis | 29/841 |
| 2004/0248337 A1* | 12/2004 | Yan et al. | 438/64 |
| 2004/0253763 A1* | 12/2004 | Punzalan et al. | 438/111 |
| 2006/0027479 A1* | 2/2006 | Auburger et al. | 206/497 |
| 2007/0108565 A1* | 5/2007 | Shim et al. | 257/676 |

* cited by examiner

*Primary Examiner* — Jarrett J Stark
*Assistant Examiner* — Lawrence Tynes, Jr.

(57) ABSTRACT

A method and packaging for semiconductor devices and integrated circuits is disclosed that eliminates warpage stress on packages caused by coefficient of thermal expansion (CTE) mismatch between the device, lead frame or die paddle and a molding compound. Generally, the method includes steps of: (i) mounting the die on which the device is fabricated to a die paddle of a leadframe; and (ii) encapsulating the die on the die paddle and at least a portion of the leadframe in a molding compound, wherein a difference between a first volume of molding compound above a plane of the leadframe and a second volume of molding compound below the plane of the leadframe is sufficiently reduced to substantially eliminate warpage of the finished package due to mismatch of CTEs of the device, lead frame and packaging compound. The die paddle may be etched or reduced to facilitate molding compound flowing under the plane of the leadframe. Other embodiments are also disclosed.

20 Claims, 4 Drawing Sheets

WARPAGE-COMPENSATING DIE PADDLE DESIGN FOR HIGH THERMAL-MISMATCHED PACKAGE CONSTRUCTION

CROSS-REFERENCE TO RELATED APPLICATIONS

The present application claims the benefit of priority under 35 U.S.C. 119(e) to U.S. Provisional Patent Application Ser. No. 60/802,854, filed May 23, 2006, entitled Warpage-Compensating Die Paddle Design for High Thermal-Mismatched Package Construction; which application is hereby incorporated by reference.

TECHNICAL FIELD

This invention pertains generally to fabrication of semiconductor devices, and more particularly to methods and structures for packaging devices that eliminates warpage stress on packages caused by coefficient of thermal expansion mismatch.

BACKGROUND OF THE INVENTION

Semiconductor devices such as integrated circuits (ICs) are fabricated in or on a surface of a semiconductor substrate or wafer that is subsequently divided or diced into a number of discrete chips or dies each having a device or IC formed thereon. One or more dies are then enclosed in a package that provides physical and chemical protection of the die(s) while electrically connecting it with outside circuitry. Packages for semiconductor devices are available in the very wide variety of designs depending on the desired electrical connections out of the package, required heat dissipation, and other physical requirements, such optical transparency.

Molded packages, such as that shown in FIG. 1A, are produced by attaching the die 102 to a flag or die paddle 104 of a leadframe 106, electrically coupling circuit elements on the die to conductors or lead fingers 108 on the lead frame using a bonding wire 110, and encapsulating the die and at least a portion of the lead frame in a plastic molding compound 112 using an injection or transfer molding process. Molded packages 100 provide a number of advantages including a lower per unit cost, and the ability to simultaneously package multiple dies in a sheet or a number of strips, which are subsequently divided to yield individually packaged devices or ICs. However, molded packages 100 also suffer from a number of drawbacks or disadvantages.

Referring to FIGS. 1A and 1B, conventional molded packages 100 are asymmetrical along a vertical axis, often having a full-metal die paddle 104 exposed on the bottom of the package, while the bulk of the molding compound 112 is above the plane of the leadframe 106. This arrangement is problematic when the molding compound 112 has a high coefficient-of-thermal-expansion (CTE) relative to those of leadframe 106 and or die 102. For example, an optically clear plastic molding compound typically has a CTE of from about 60 to about 70 parts-per-million (ppm), while a copper (Cu) based leadframe has a CTE of about 15 to 20 ppm, and a silicon die a CTE of about 3 to 5 ppm. The mismatch of CTEs can produce warpage stresses in the resulting package 100 both during packaging and during in operation of the finished device, which can potentially delaminate the package, the packaged device or break electrical connections thereto.

In addition, bending or warpage of the package 100 can interrupt or degrade electrical or optical coupling to adjacent components. This is particularly a problem with optical devices packaged in an optically clear molding compound since bending or other mechanical stresses imposed thereon may cause degradation of optical performance by inducing changes in optical transmission properties of the package.

A block diagram illustrating a cross-sectional side view of the package 100 of FIG. 1A exhibiting warpage stress on the package caused by CTE mismatch is shown in FIG. 1B. In the example shown, optoelectronic devices on the die 102 were packaged in a transfer molding process using a heated optically clear, plastic molding compound 112. During cooling of the molded package 100 the top portion, consisting mainly of plastic molding compound, experiences a much greater contraction than the lower portion containing the metal leadframe 106, resulting in the warpage 114 shown.

Accordingly, there is a need for a low cost molded package and packaging method for semiconductor devices and ICs that reduces warpage stress due to CTE mismatch. It desirable that the package and method be suitable for use with optically clear plastic molding compound having a high CTE. It is still further desirable that the package and method be compatible with an automated backend assembly or packaging process.

The present invention provides a solution to these and other problems, and offers further advantages over conventional processes.

BRIEF DESCRIPTION OF THE DRAWINGS

These and various other features and advantages of the present invention will be apparent upon reading of the following detailed description in conjunction with the accompanying drawings and the appended claims provided below, where:

DETAILED DESCRIPTION

The present invention is directed generally to methods and packages for packaging semiconductor devices or integrated circuits (ICs) that substantially eliminate warpage stresses caused by coefficient of thermal expansion (CTE) mismatch.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "one embodiment" in various places in the specification do not necessarily all refer to the same embodiment.

Briefly, the present invention involves reducing or minimizing a difference in a volume of molding compound above and below a plane of the leadframe to which a die on which the device is fabricated is mounted.

The method and packaging of the present invention is particularly useful in packaging integrated circuits or semiconductor devices including optically active elements, such VCSELs, LEDs, photo-diodes, photo-transistors or the like, in a clear transfer molding compound (CTM).

Methods and structures for packaging devices or ICs that substantially eliminates warpage stress on packages caused by CTE will now be described in greater detail with reference to FIGS. 2 through 6.

Figure 1A:
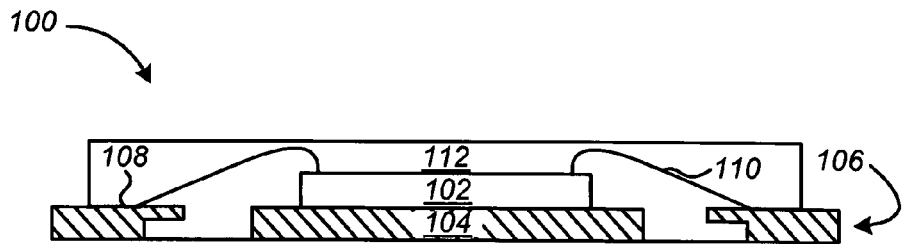
FIG. 1A (prior art) is a block diagram illustrating a cross-sectional side view of a die in a package with an exposed full metal paddle.
Figure 1B:
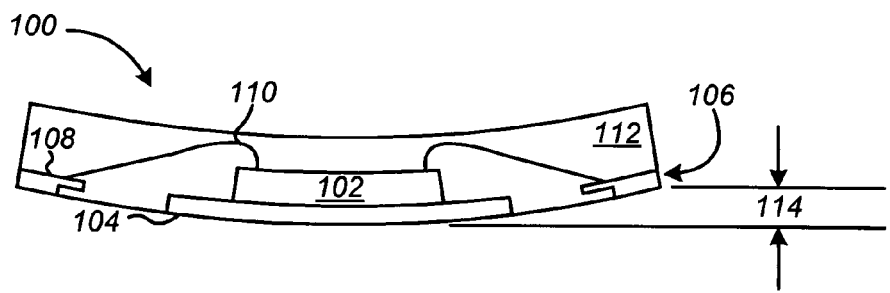
FIG. 1B (prior art) is a block diagram illustrating a cross-sectional side view of the package of FIG. 1A exhibiting warpage stress on the package caused by coefficient of thermal expansion (CTE) mismatch.
Figure 2:
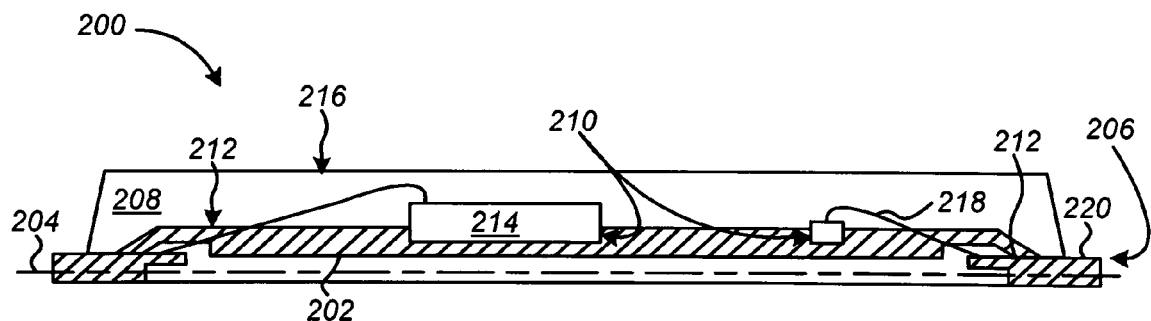
FIG. 2 is a block diagram illustrating a cross-sectional side view of a die in a package having a top half etched, upset die paddle according to an embodiment of the present invention.

Referring to the package 200 shown in FIG. 2, according to one embodiment of the invention a die paddle 202 is raised or upset from a plane (indicated by line 204) of the leadframe 206 reducing or minimizing the difference in a volume of molding compound 208 above and below the plane of the leadframe. Reducing this difference in volume reduces asymmetry of the package 200 sufficiently to substantially eliminate warpage due to CTE mismatch.

In certain embodiments, the asymmetry of the package 200 is further reduced by etching or machining cavities or recesses 210 into a top surface 212 of the die paddle 202 to receive the one or more dies 214 to be packaged. A further advantage of this embodiment, is the die 214 are affixed to the die paddle 202 in these recesses 210, thereby ensuring correct placement of the die and facilitating use of an automated backend assembly or packaging process. More preferably as shown in FIG. 2, the recesses 210 are sufficiently deep to provide clearance between the die 214 and a top surface 216 of the finished package 200 for wire bond loops 218 extending from the die to lead fingers 220 on the lead frame 206. This embodiment may be particularly advantageous for use with certain optoelectronic devices and ICs as it reduces the volume or thickness of molding compound 208 through which light must be transmitted.

In another embodiment, shown in FIG. 3, a bottom portion or lower surface 302 of a die paddle 304 is etched or machined to yield a reduced metal pad (RMP), which enables a larger volume of molding compound 306 to flow below the plane of the leadframe 308. Optionally or preferably, as in the embodiment shown, at least a portion of the lead fingers 310 on the lead frame 308 to which circuits on a die 312 are electrically coupled through bonding wire 314 are also reduced. It will be appreciated that the portion of the lead fingers 310 that will extend outside of the molding compound will have little effect on package 300 warpage and thus are generally not reduced. Moreover to insure the integrity of the attachment of the lead fingers 310 to the package 300, it is desirable that the lead fingers remain un-thinned or reduced for some distance into the molding compound of the package.

Generally, the die paddle 304 and a portion of the lead fingers 310 are etched or machined to reduce a thickness of the metal by about half or 50%. However, it will be appreciated or understood that this reduction of one half the metal thickness is exemplary only, and the thickness may be reduced by a greater or a lesser amount, and the metal may be eliminated entirely in certain areas of the die paddle 304 without departing from the scope and spirit of the present invention. The reduction in the metal of the die paddle 304 is limited only by the mechanical requirements of the leadframe 308 and, possibly, the heat transfer or cooling requirements of the die 312. Generally, the volume of metal of the die paddle 304 can be reduced by from about 20% to about 70% as needed to increase a volume of molding compound 306 below the plane of the leadframe 308, and without detrimentally impacting performance of the packaged device.

Figure 3:
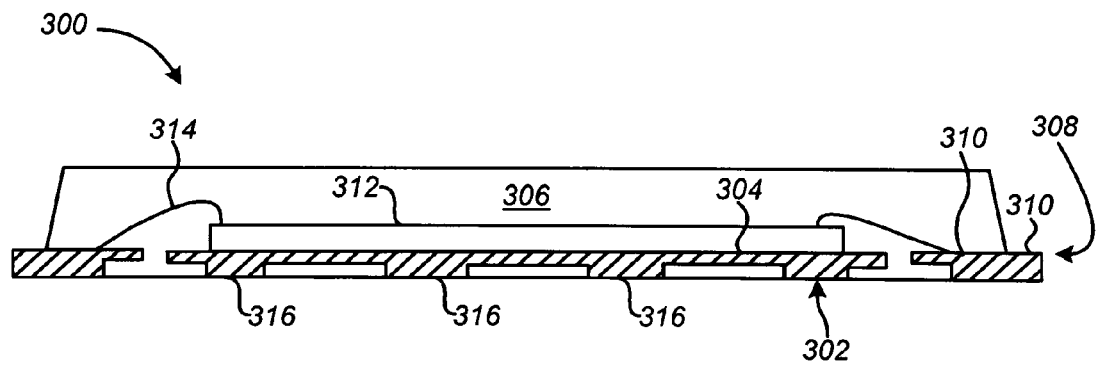
FIG. 3 is a block diagram illustrating a cross-sectional side view of a die in a package having a bottom half etched reduced metal paddle (RMP) according to another embodiment of the present invention.

Optionally, as shown in FIG. 3, the metal of the die paddle 304 may be left un-etched in certain areas or regions to leave a number of posts 316 having the full metal thickness of leadframe 308 extending from the lower surface of the die 312 to a lower surface of the package 300.

Figure 4:
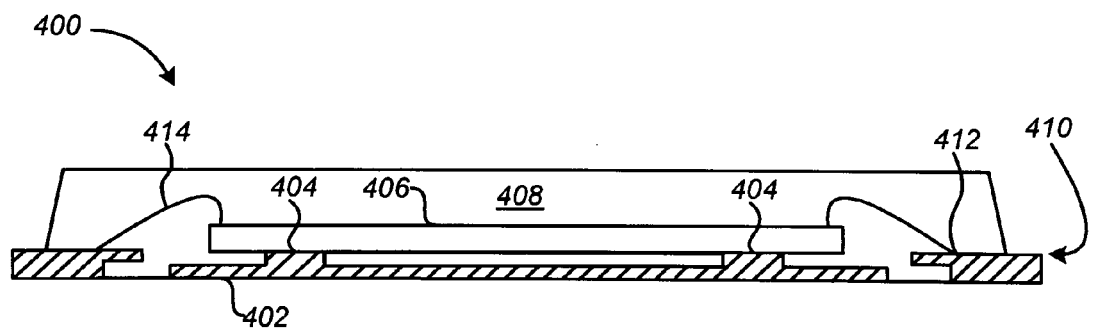
FIG. 4 is a block diagram illustrating a cross-sectional side view of a die in a package having a top half etched, raised dot die paddle according to an embodiment of the present invention.

In yet another embodiment, shown in FIG. 4, a top portion or surface of the die paddle 402 is etched or machined to yield a RMP having a number of raised dot pads 404 on which a die 406 is mounted. The etched or machined top surface of the die paddle 402 enables molding compound 408 to flow below the die 406 mounted thereon, thereby increasing the volume of molding compound below the plane of the leadframe 410. As with the bottom etched embodiment described above with reference to FIG. 3, at least a portion of lead fingers 412 on the lead frame 410 to which circuits on the die 406 are electrically coupled through bonding wire 414 may also be reduced. Although the lead fingers 412 are shown as having a portion of a lower surface reduced, it will be understood that they may instead be reduced by having a portion of the top surface machined or etched without departing from the scope and spirit of the present invention.

Figure 5A:
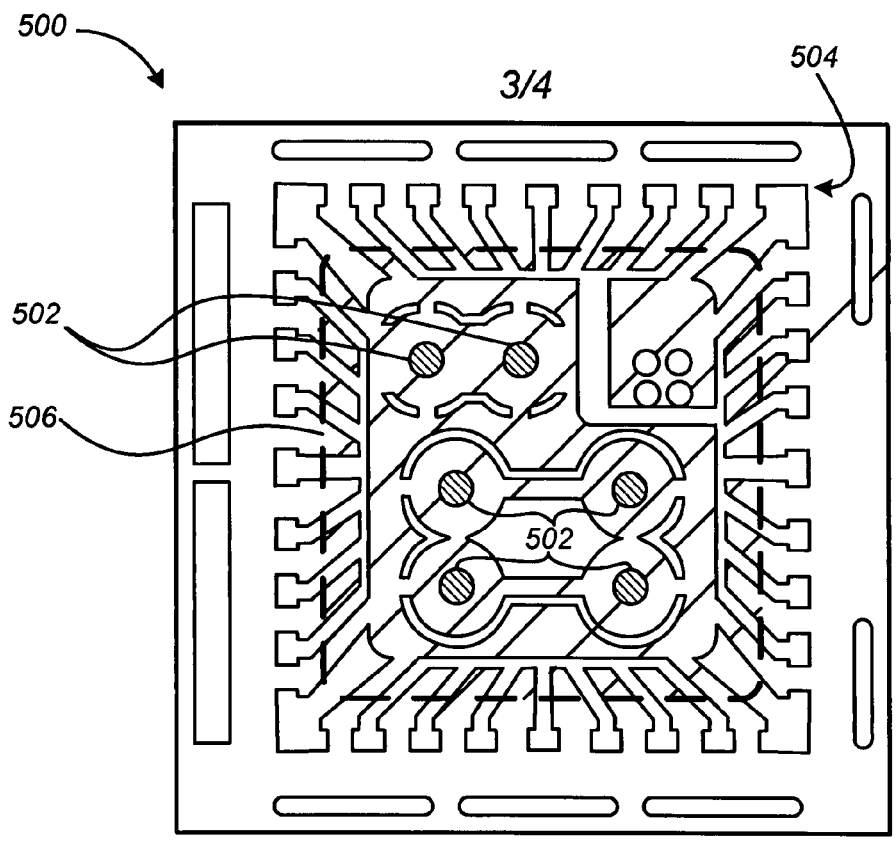
FIG. 5A is a planar view of a RMP according to an embodiment of the present invention.
Figure 5B:
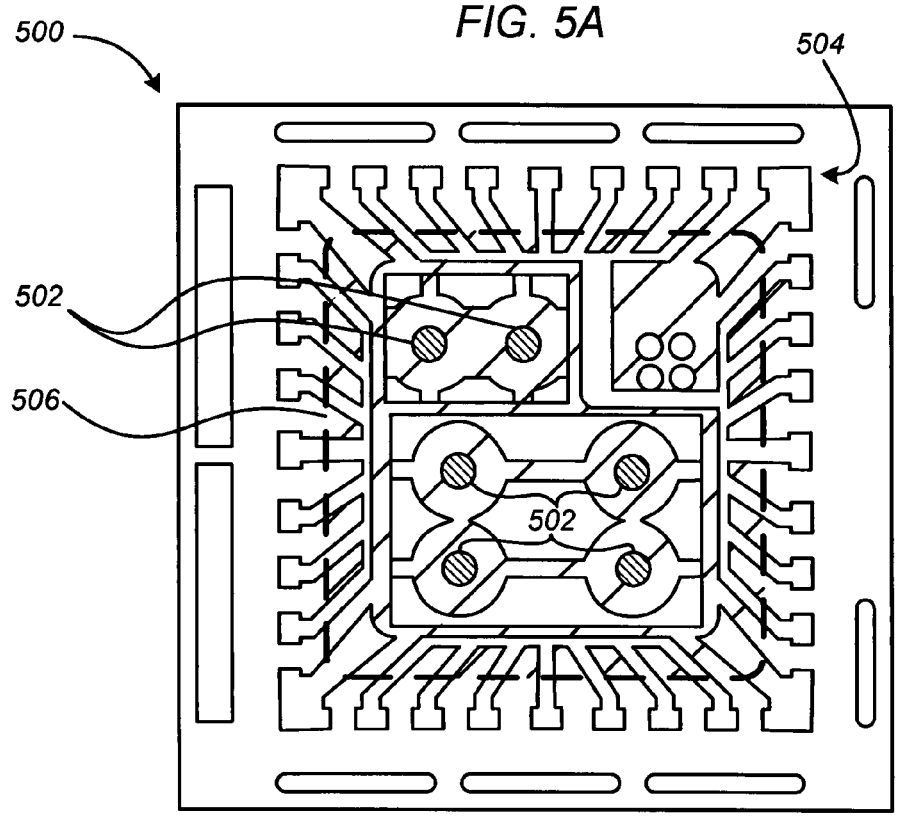
FIG. 5B is a planar view of a RMP according to another embodiment of the present invention.

Planar views of leadframes having reduced metal die paddles or RMPs according to various embodiments of the present invention are shown in FIGS. 5A and 5B. Referring to FIGS. 5A and 5B, the heavily hatched areas of the lead frame 500 indicate areas having the full thickness of the un-etched lead frame, such as posts 502, while lightly hatched areas indicate areas in which the thickness of the lead frame has been reduced and un-hatched areas indicate areas in which all of the metal has been removed. Note that the above described hatching legend applies to the die paddle of the leadframe 500 and the portion of the lead fingers 504 inside the dashed rectangular line 506, which indicates the portion of the lead frame 500 that will later be covered by a molding compound. The rest of the lead fingers 504, which are shown as un-hatched, remain un-etched or machined.

It will be appreciated by those skilled in the art that two or more of the above described embodiments can be combined in a single package or packaging method. For example, a package having a raised or upset die paddle as described in connection with FIG. 2 may further include or utilize a RMP having an etched or machined surface as described in connection with FIG. 3 or 4.

Figure 6:
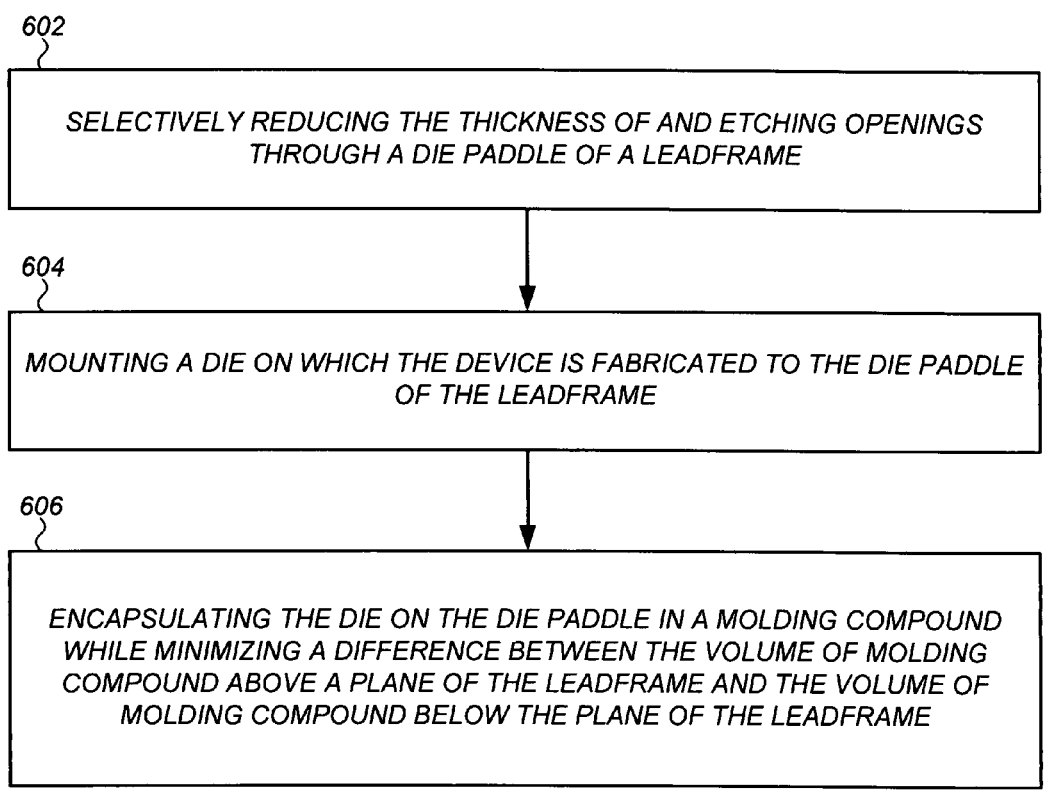
FIG. 6 is a flowchart of a method of packaging a semiconductor device according to an embodiment of the present invention.

A method of packaging a semiconductor device according to a preferred embodiment of the present invention will now be summarized with reference to the flowchart of FIG. 6. Referring to FIG. 6, the method generally includes steps of: (i) selectively reducing the thickness of and etching openings through a die paddle of a leadframe (step 602); mounting a die on which the device is fabricated to the die paddle of the leadframe (step 604); and encapsulating the die on the die paddle in a molding compound, such that a difference between a first volume of molding compound above a plane of the leadframe and a second volume of molding compound below the plane of the leadframe is sufficiently reduced to substantially eliminate warpage stress on the finished package caused by coefficient of thermal expansion (CTE) mismatch between the device, lead frame and the molding compound (step 606).

The advantages of the package and method of the present invention over previous or conventional approaches include: (i) reduction in warpage stress due to CTE mismatch substantially eliminating warpage of or damage to a molded package and the enclosed device both immediately following packaging and during operation of the device; (ii) compatible with existing automated backend assembly and/or packaging processes; (iii) compatible with a wide range of molding compounds, including optically clear molding compounds having high CTEs; (iv) compatible or adaptable to multi-chip packages; and (v) compatible or adaptable to a wide range of package types including quad flat leaded packages (QFP) and quad flat no-lead packages (QFN), such as those having a ball-grid array (BGA)

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents. The scope of the present invention is defined by the claims, which includes known equivalents and unforeseeable equivalents at the time of filing of this application.

What is claimed is:

1. A method of packaging a semiconductor device in a package, the method comprising:
    mounting a die on which the semiconductor device is fabricated to a die paddle of a leadframe, wherein the die paddle is offset above a plane formed by the leadframe and the die is mounted on a top portion of the die paddle facing away from the plane formed by the leadframe; and
    encapsulating the die on the die paddle in a first volume of molding compound above the leadframe and the die and a second volume of molding compound below the leadframe, a first volume of molding compound above the leadframe and the die and a second volume of molding compound below the leadframe, wherein the first volume of molding and the second volume of molding compound are substantially equal to substantially eliminate warpage stress on the package caused by coefficient of thermal expansion (CTE) mismatch between the device, the package, and the molding compound.

2. A method according to claim 1, further comprising etching a recess in a top portion of the die paddle, and wherein mounting the die on the die paddle comprises mounting the die in the recess.

3. A method according to claim 2, wherein the etching a recess in the top portion of the die paddle comprises etching a recess sufficiently deep to provide clearance between the die and a top surface of the finished packaging for a number of wire bond loops extending from the die to a number of lead fingers on the leadframe.

4. A method according to claim 1, further comprising etching a bottom portion of the die paddle to yield a reduced metal pad (RMP), which enables a larger second volume of molding compound to flow below the plane of the leadframe.

5. A method according to claim 1, further comprising etching a top portion of the die paddle to yield a reduced metal pad (RMP) including a number of raised dot pads to which the die is mounted, thereby enabling molding compound to flow below the die mounted on the die paddle and increasing the second volume of molding compound below the plane of the die paddle.

6. A method according to claim 1, wherein the molding compound comprises an optically transparent molding compound.

7. A method of packaging an optical-electronic device in a package, the method comprising:
    determining, based on a coefficient of thermal expansion of an optically transparent molding compound, a first volume of the optically transparent molding compound and a second volume of the optically transparent molding compound to be used in the package;
    mounting a die on which the optical-electronic device is fabricated to a die paddle of a leadframe, wherein the die paddle is offset above a plane formed by the leadframe and the die is mounted on a top portion of the die paddle facing away from the plane formed by the leadframe; and
    encapsulating the die on the die paddle in the optically transparent molding compound to form the package, wherein the first volume of the optically transparent molding compound and the second volume of the optically transparent molding compound are substantially equal to reduce warpage stress on the package.

8. A method according to claim 7, further comprising etching a top portion of the die paddle having a reduced metal pad (RMP).

9. A method according to claim 7, further comprising etching a recess in a top portion of the die paddle, and wherein the step of mounting the die on the die paddle comprises the step of mounting the die in the recess.

10. A method according to claim 7, wherein the package comprises a quad flat no-lead (QFN) package.

11. A method of packaging a semiconductor device in a package, the method comprising:
    etching an opening through a die paddle of a leadframe to yield a reduced metal pad (RMP);
    offsetting the die paddle above a plane formed by the leadframe;
    mounting a die on which the semiconductor device is fabricated to a top portion of the die paddle facing away from the plane formed by the leadframe; and
    encapsulating the die on the die paddle in a first volume of molding compound above the leadframe and the die and a second volume of molding compound below the leadframe, wherein the offsetting the die paddle and etching the opening through the die paddle enables a larger second volume of molding compound below the leadframe to substantially eliminate warpage stress on the package caused by differences between the first volume of molding compound and the second volume of molding compound.

12. The method of claim 11, further comprising etching a lower portion of lead fingers of the leadframe to reduce a thickness thereof, thereby increasing the second volume of molding compound.

13. The method of claim 11, further comprising etching the die paddle to reduce a thickness thereof.

14. The method of claim 13, wherein etching the die paddle to reduce the thickness thereof comprises etching a bottom portion of the die paddle.

15. The method of claim 13, wherein etching the die paddle to reduce the thickness thereof comprises etching the top portion of the die paddle.

16. The method of claim 15, wherein etching the top portion of the die paddle comprises etching the top portion of the die paddle to form raised dot pads to which the die is mounted, thereby enabling molding compound to flow below the die mounted on the die paddle and increasing the second volume of molding compound.

17. The method of claim 15, further comprising etching a recess in the top portion of the die paddle, and wherein mounting the die on the die paddle comprises mounting the die in the recess.

18. The method of claim 17, wherein the etching a recess in the top portion of the die paddle comprises etching a recess sufficiently deep to provide clearance between the die and a top surface of the finished packaging for wire bond loops extending from the die to lead fingers of the leadframe.

19. The method of claim 13, wherein etching the die paddle to reduce the thickness thereof comprises etching the die paddle to reduce the thickness by at least about 20%.

20. The method of claim 11, wherein the molding compound comprises an optically transparent molding compound.

\* \* \* \* \*